US012684860B2

(12) United States Patent
Minamikawa et al.

(10) Patent No.: US 12,684,860 B2
(45) Date of Patent: Jul. 14, 2026

(54) SEMICONDUCTOR DEVICE

(71) Applicants:Kabushiki Kaisha Toshiba, Tokyo
(JP); **Toshiba Electronic Devices &
Storage Corporation**, Tokyo (JP)

(72) Inventors: Kazuki Minamikawa, Nomi Ishikawa
(JP); Daiki Yoshikawa, Kanazawa
Ishikawa (JP); Kazutoshi Nakamura,
Nonoichi Ishikawa (JP)

(73) Assignees: Kabushiki Kaisha Toshiba, Kawasaki
(JP); **Toshiba Electronic Devices &
Storage Corporation**, Kawasaki (JP)

( * ) Notice: Subject to any disclaimer, the term of this
patent is extended or adjusted under 35
U.S.C. 154(b) by 351 days.

(21) Appl. No.: 18/243,646

(22) Filed: Sep. 7, 2023

(65) Prior Publication Data

US 2024/0321871 A1 Sep. 26, 2024

(30) Foreign Application Priority Data

Mar. 23, 2023 (JP) ................................. 2023-047012

(51) Int. Cl.
*H10D 84/80* (2025.01)
*H10D 8/60* (2025.01)
(Continued)

(52) U.S. Cl.
CPC ............. *H10D 84/811* (2025.01); *H10D 8/60*
(2025.01); *H10D 12/481* (2025.01); *H10D
62/102* (2025.01); *H10D 64/231* (2025.01)

(58) Field of Classification Search
None
See application file for complete search history.

(56) References Cited

U.S. PATENT DOCUMENTS

| | | | |
|---|---|---|---|
| 10,770,582 B2 | 9/2020 | Kobayashi et al. | |
| 11,069,771 B2 | 7/2021 | Nakagawa et al. | |

(Continued)

FOREIGN PATENT DOCUMENTS

| | | |
|---|---|---|
| CN | 103489785 A | 1/2014 |
| JP | 2013-243207 A | 12/2013 |

(Continued)

OTHER PUBLICATIONS

Office Action issued in Japanese Patent Application No. 2023-047012, dated Feb. 18, 2026 in 12 pages.

*Primary Examiner* — Khaja Ahmad
(74) *Attorney, Agent, or Firm* — Knobbe, Martens, Olson
& Bear, LLP

(57) ABSTRACT

According to one embodiment, a semiconductor device
includes a first electrode, a first semiconductor region of a
first conductivity type, a second semiconductor region of a
second conductivity type, a third semiconductor region of
the second conductivity type, and a second electrode. The
third semiconductor region is located on the second semi-
conductor region, and has a higher second-conductivity-type
impurity concentration than the second semiconductor
region. The second electrode is located on the third semi-
conductor region. The second electrode includes a first part
and a second part. The first part is located in the second
semiconductor region. The second part is positioned on the
first part, and contacts the third semiconductor region in a
second direction perpendicular to a first direction from the
first electrode toward the first semiconductor region. A
length of the first part is greater than a length of the second
part in the second direction.

17 Claims, 11 Drawing Sheets

(51) Int. Cl.
  H10D 12/00      (2025.01)
  H10D 62/10      (2025.01)
  H10D 64/23      (2025.01)

(56)              References Cited

U.S. PATENT DOCUMENTS

| | | | |
|---|---|---|---|
| 11,121,242 B2 | 9/2021 | Laven et al. | |
| 2017/0148786 A1* | 5/2017 | Matsushita | H10D 12/038 |
| 2018/0151558 A1* | 5/2018 | Cheng | H10D 62/142 |
| 2018/0226399 A1* | 8/2018 | Tamaki | H10D 64/517 |
| 2019/0245036 A1 | 8/2019 | Nishiguchi | |
| 2020/0091324 A1* | 3/2020 | Kawamura | H10D 8/60 |
| 2020/0287029 A1 | 9/2020 | Ishikawa et al. | |
| 2021/0296477 A1 | 9/2021 | Matsudai et al. | |

FOREIGN PATENT DOCUMENTS

| | | |
|---|---|---|
| JP | 2019-134149 A | 8/2019 |
| JP | 2019-161199 A | 9/2019 |
| JP | 2020-043243 A | 3/2020 |
| JP | 2020-145288 A | 9/2020 |
| JP | 2021-150483 A | 9/2021 |
| WO | 2022-044099 A1 | 3/2022 |

* cited by examiner

SEMICONDUCTOR DEVICE

CROSS-REFERENCE TO RELATED APPLICATIONS

This application is based upon and claims the benefit of priority from Japanese Patent Application No. 2023-047012, filed on Mar. 23, 2023; the entire contents of which are incorporated herein by reference.

FIELD

Embodiments of the invention generally relate to a semiconductor device.

BACKGROUND

Semiconductor devices such as diodes, reverse conducting insulated gate bipolar transistors (RC-IGBTs), and the like are used in applications such as power conversion and the like. It is desirable for the switching loss of such semiconductor devices to be small.

DETAILED DESCRIPTION

Figure 1:
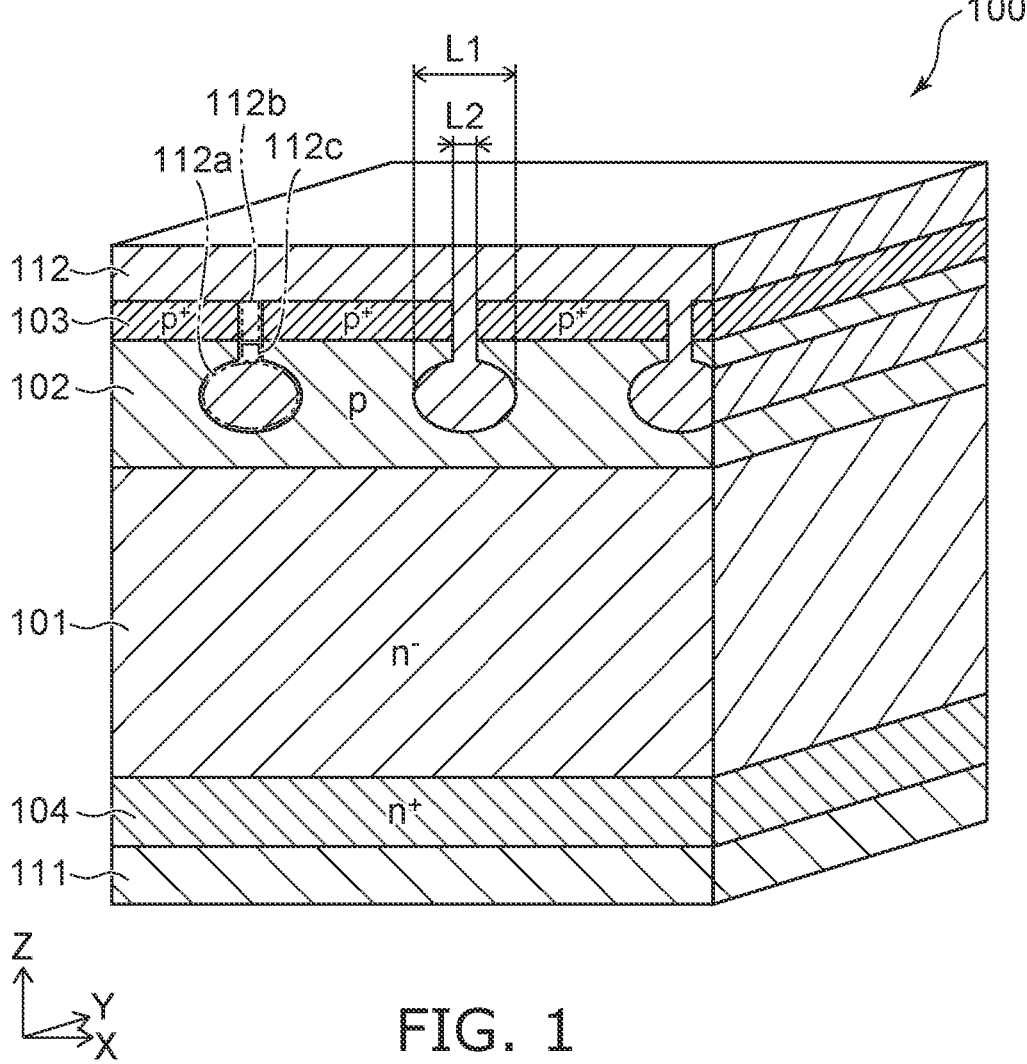
FIG. 1 is a perspective cross-sectional view showing a portion of a semiconductor device according to a first embodiment.

According to one embodiment, a semiconductor device includes a first electrode, a first semiconductor region of a first conductivity type, a second semiconductor region of a second conductivity type, a third semiconductor region of the second conductivity type, and a second electrode. The first semiconductor region is located on the first electrode. The second semiconductor region is located on the first semiconductor region. The third semiconductor region is located on the second semiconductor region, and has a higher second-conductivity-type impurity concentration than the second semiconductor region. The second electrode is located on the third semiconductor region. The second electrode includes a first part and a second part. The first part is located in the second semiconductor region. The second part is positioned on the first part. The second part contacts the third semiconductor region in a second direction perpendicular to a first direction that is from the first electrode toward the first semiconductor region. A length in the second direction of the first part is greater than a length in the second direction of the second part.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

In the following description, the notations "n+", "n" and "n-" and the notations "p+" and "p" represent the relative levels of impurity concentrations of the conductivity types. Specifically, the notation "n+" indicates that the n-type impurity concentration is relatively higher than the notation "n", and the notation "n-" indicates that the n-type impurity concentration is relatively lower than the notation "n". The notation "p+" indicates that the p-type impurity concentration is relatively higher than the notation "p".

The embodiments described below may be carried out with the p-type and the n-type of the semiconductor regions inverted.

An XYZ orthogonal coordinate system is used in the description of embodiments. The direction from a first electrode toward a first semiconductor region is taken as a Z-direction (a first direction). Two mutually-orthogonal directions perpendicular to the Z-direction are taken as an X-direction (a second direction) and a Y-direction (a third direction). In the description, the direction from the first electrode toward the first semiconductor region is called "up", and the opposite direction is called "down". These directions are based on the relative positional relationship between the first electrode and the first semiconductor region, and are independent of the direction of gravity.

First Embodiment

FIG. 1 is a perspective cross-sectional view showing a portion of a semiconductor device according to a first embodiment.

The semiconductor device according to the first embodiment is a diode. As shown in FIG. 1, the semiconductor device 100 according to the first embodiment includes an n⁻-type cathode region 101 (an example of a first semiconductor region), a p-type anode region 102 (an example of a second semiconductor region), a p⁺-type anode region 103 (an example of a third semiconductor region), an n⁺-type cathode region 104, a cathode electrode 111 (an example of a first electrode), and an anode electrode 112 (an example of a second electrode).

The cathode electrode 111 is located at the lower surface of the semiconductor device 100. The n⁺-type cathode region 104 is located on the cathode electrode 111 and is electrically connected with the cathode electrode 111. The n⁻-type cathode region 101 is located on the n⁺-type cathode region 104. The n-type impurity concentration of the n⁻-type cathode region 101 is less than the n-type impurity concentration of the n⁺-type cathode region 104.

The p-type anode region 102 is located on the n⁻-type cathode region 101. A p-n junction is formed between the n⁻-type cathode region 101 and the p-type anode region 102. The p⁺-type anode region 103 is located on the p-type anode region 102. The p-type impurity concentration of the p⁺-type anode region 103 is greater than the p-type impurity concentration of the p-type anode region 102.

The anode electrode 112 is located on the p-type anode region 102 and the p⁺-type anode region 103. The anode electrode 112 includes parts protruding toward the cathode electrode 111. The protruding parts include a first part 112a and a second part 112b. The first part 112a is located in the p-type anode region 102 and contacts the p-type anode region 102. The second part 112b is located on the p-type anode region 102 and is arranged with the p⁺-type anode region 103 in the X-direction. A length L1 of the first part 112a is greater than a length L2 of the second part 112b. Multiple first parts 112a and multiple second parts 112b are arranged in the X-direction. For example, the multiple first parts 112a and the multiple second parts 112b each extend in the Y-direction.

Examples of the materials of the components will now be described.

The n⁻-type cathode region 101, the p-type anode region 102, the p⁺-type anode region 103, and the n⁺-type cathode region 104 include silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity. The cathode electrode 111 and the anode electrode 112 include metals such as titanium, aluminum, etc.

For example, the n-type impurity concentration of the n⁻-type cathode region 101 is not less than $1.0 \times 10^{13}$ atoms/cm³ and not more than $1.0 \times 10^{15}$ atoms/cm³. The p-type impurity concentration of the p-type anode region 102 is not less than $1.0 \times 10^{16}$ atoms/cm³ and not more than $1.0 \times 10^{18}$ atoms/cm³. The p-type impurity concentration of the p⁺-type anode region 103 is greater than $1.0 \times 10^{18}$ atoms/cm³ and not more than $5.0 \times 10^{21}$ atoms/cm³. The n-type impurity concentration of the n⁺-type cathode region 104 is not less than $1.0 \times 10^{18}$ atoms/cm³ and not more than $1.0 \times 10^{21}$ atoms/cm³.

FIGS. 2A, 2B, 3A, 3B, 4A and 4B are cross-sectional views showing a method for manufacturing the semiconductor device according to the first embodiment.

Figure 2A:
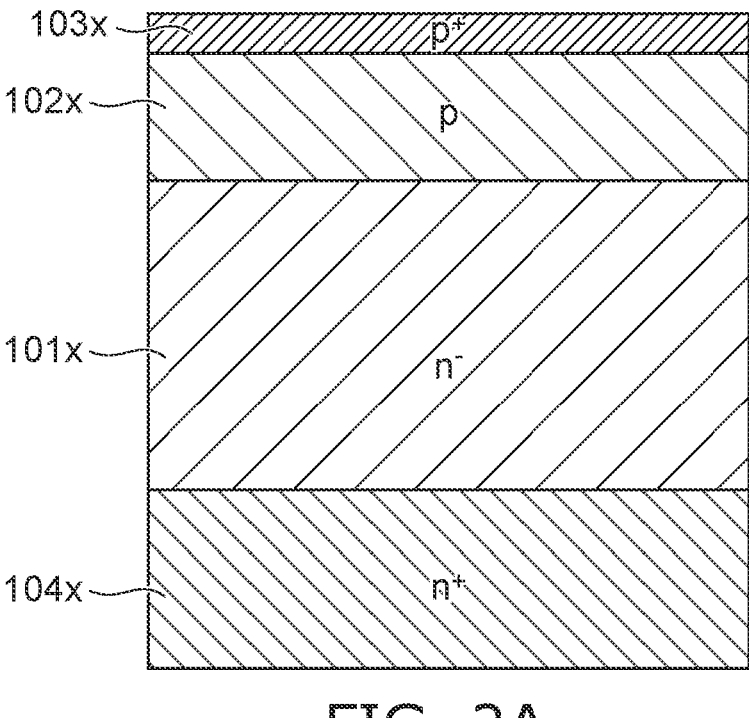
FIGS. 2A and 2B are cross-sectional views showing a method for manufacturing the semiconductor device according to the first embodiment.

First, a semiconductor substrate that includes an n⁺-type semiconductor layer 104x and an n⁻-type semiconductor layer 101x is prepared. The n⁻-type semiconductor layer 101x is located on the n⁺-type semiconductor layer 104x. A p-type semiconductor region 102x is formed by ion-implanting a p-type impurity into the surface of the n⁻-type semiconductor layer 101x. As shown in FIG. 2A, a p⁺-type semiconductor region 103x is formed by ion-implanting a p-type impurity into the surface of the p-type semiconductor region 102x.

Figure 2B:
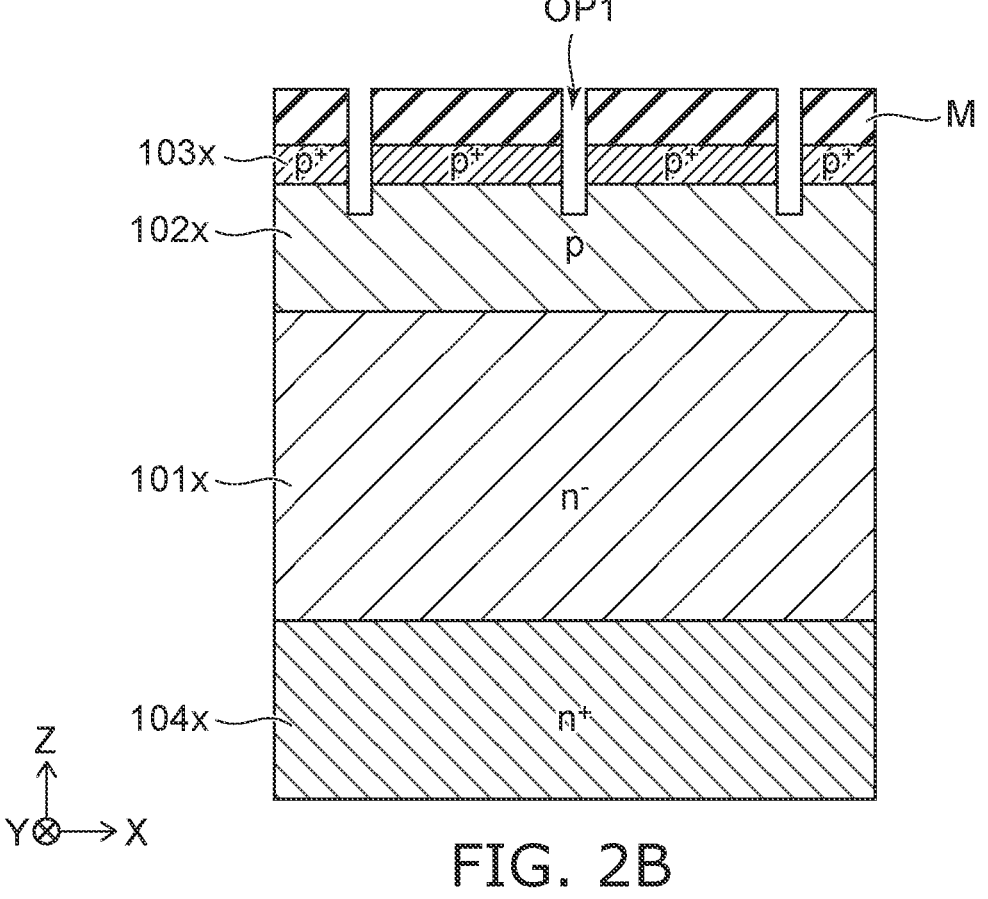

A mask M is formed by photolithography on the p-type semiconductor region 102x and the p⁺-type semiconductor region 103x. The mask M has multiple openings. A portion of the p-type semiconductor region 102x and a portion of the p⁺-type semiconductor region 103x are removed by reactive ion etching (RIE) using the mask M. As shown in FIG. 2B, an opening OP1 that extends through the p⁺-type semiconductor region 103x is formed thereby.

Figure 3A:
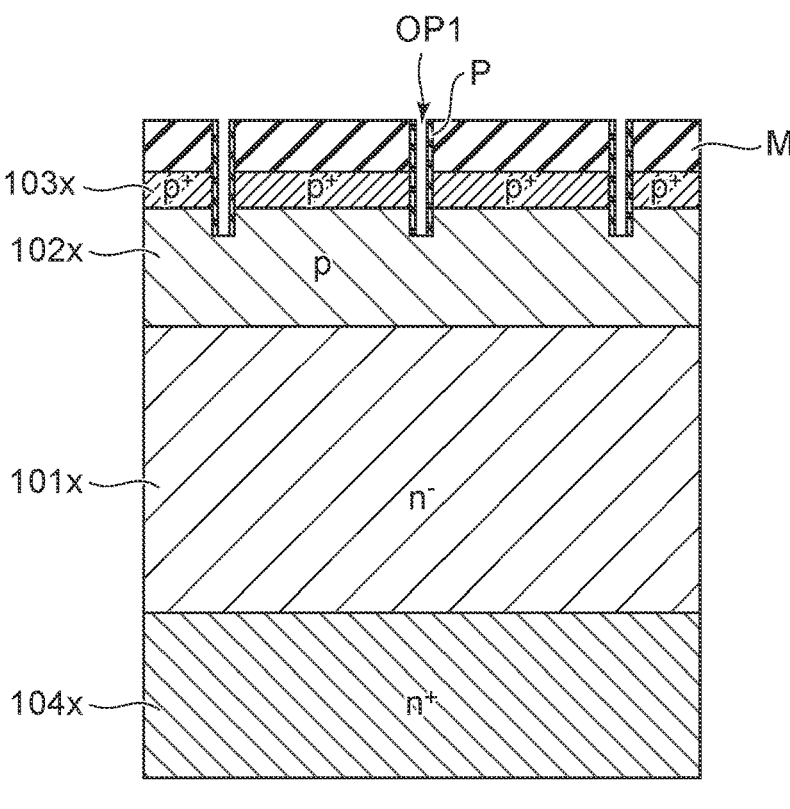
FIGS. 3A and 3B are cross-sectional views showing the method for manufacturing the semiconductor device according to the first embodiment.

A protective film P is formed along the surface of the mask M and the inner surface of the opening OP1. The protective film P that is formed on the upper surface of the mask M and the bottom surface of the opening OP1 is removed by anisotropic etching. As a result, as shown in FIG. 3A, the protective film P remains only at the sidewall of the opening OP1.

Figure 3B:
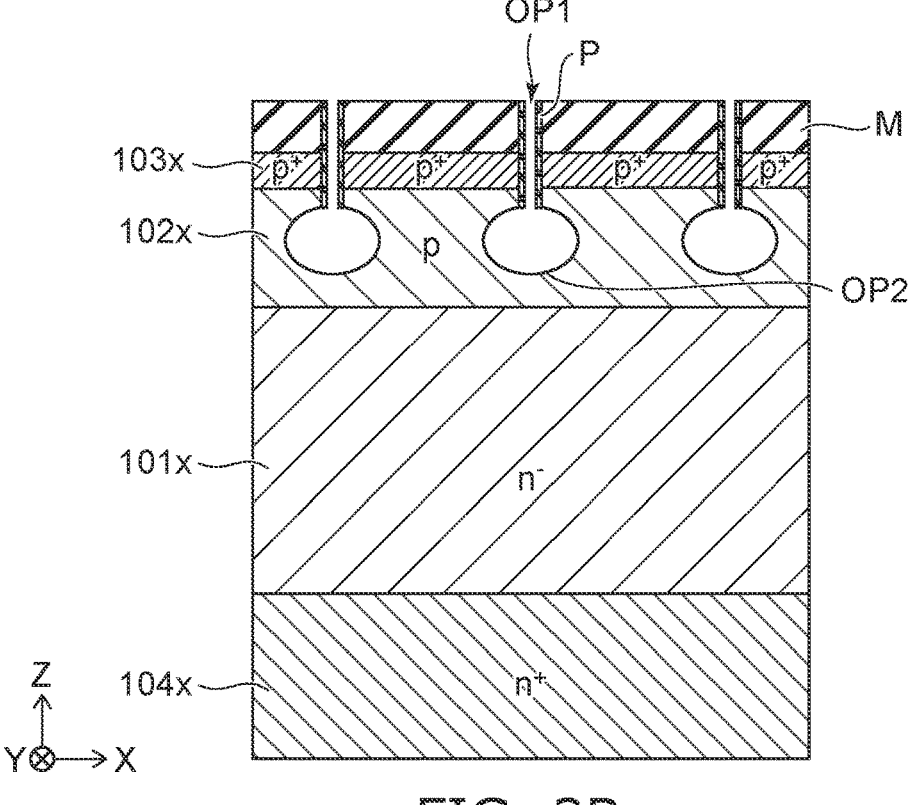

A portion of the p-type semiconductor region 102x is removed by isotropic ion etching via the opening OP1. As shown in FIG. 3B, the p-type semiconductor region 102x is isotropically etched from the bottom portion of the opening OP1. A wider opening OP2 is formed under the opening OP1.

Figure 4A:
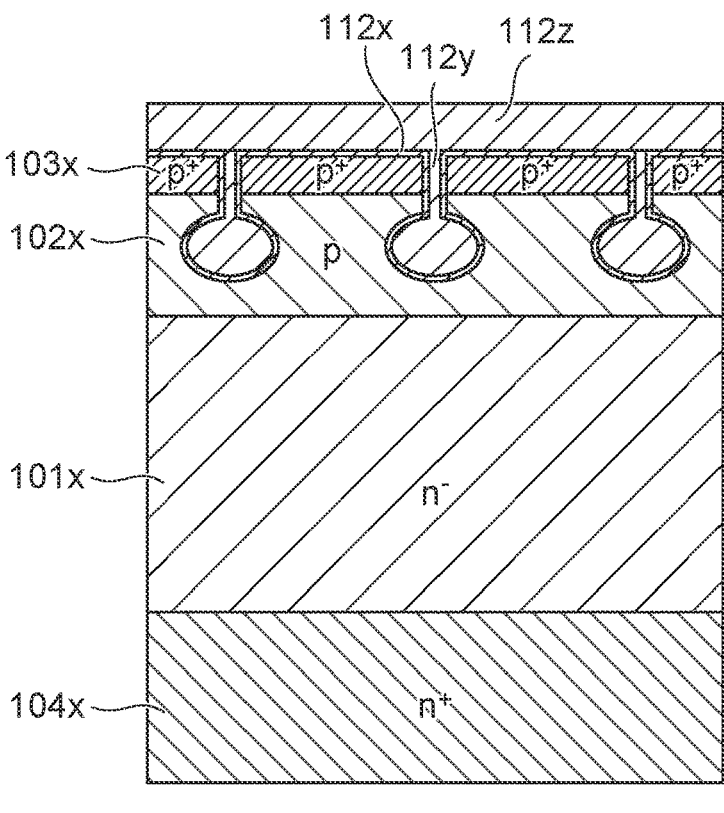
FIGS. 4A and 4B are cross-sectional views showing the method for manufacturing the semiconductor device according to the first embodiment.

The mask M and the protective film P are removed. A metal layer 112x and a metal layer 112y are formed by chemical vapor deposition (CVD). The metal layer 112x includes titanium. The metal layer 112y includes tungsten. The opening OP1 and the opening OP2 are filled with the metal layers 112x and 112y. As shown in FIG. 4A, a metal layer 112z is formed by sputtering on the metal layers 112x and 112y. The metal layer 112z includes aluminum.

Figure 4B:
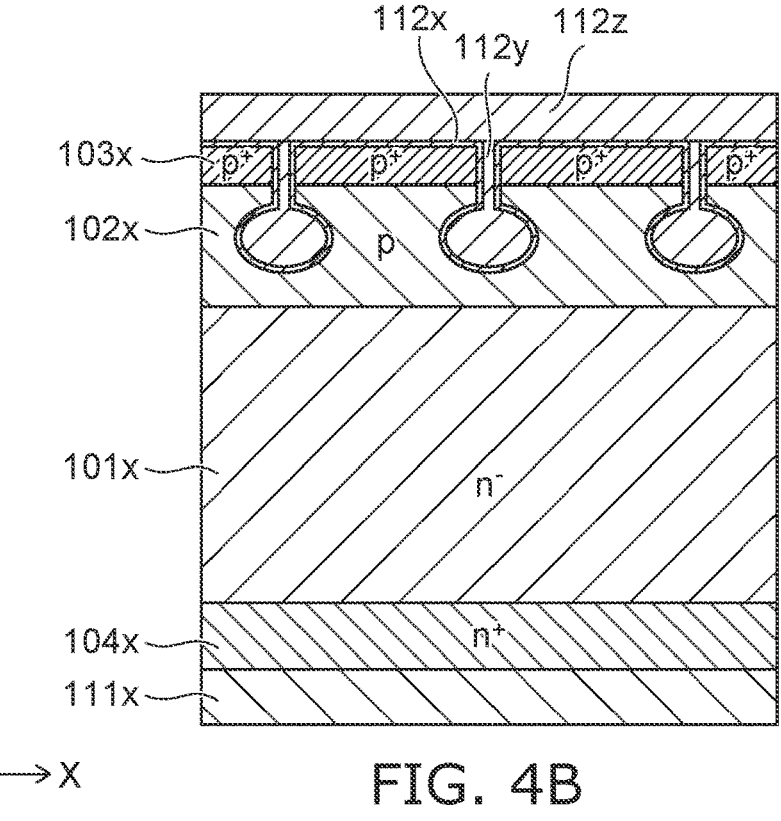

The back surface of the n⁺-type semiconductor layer 104x is polished until the n⁺-type semiconductor layer 104x has a prescribed thickness. As shown in FIG. 4B, a metal layer 111x is formed by sputtering on the polished back surface. Thus, the semiconductor device 100 according to the first embodiment is manufactured.

Operations of the semiconductor device 100 will now be described.

When a positive voltage with respect to the cathode electrode 111 is applied to the anode electrode 112, a forward voltage is applied between the n⁻-type cathode region 101 and the p-type anode region 102. The semiconductor device 100 is set to the on-state thereby, and a current flows from the anode electrode 112 toward the cathode electrode 111. At this time, holes are injected from the anode electrode 112 into the n⁻-type cathode region 101; and electrons are injected from the cathode electrode 111 into the n⁻-type cathode region 101.

Subsequently, when a positive voltage with respect to the anode electrode 112 is applied to the cathode electrode 111, the current from the anode electrode 112 to the cathode electrode 111 stops. The semiconductor device 100 is switched from the on-state to the off-state. At this time, the electrons and holes that accumulated in the n⁻-type cathode region 101 are discharged respectively to the cathode electrode 111 and the anode electrode 112.

Advantages of the first embodiment will now be described.

The carriers that are discharged from the n⁻-type cathode region 101 when the semiconductor device 100 is switched to the off-state can be reduced by reducing the carriers accumulated in the n⁻-type cathode region 101 when the semiconductor device 100 is in the on-state. In other words, the switching of the semiconductor device 100 is faster, and the switching loss of the semiconductor device 100 is reduced. In the semiconductor device 100, the anode electrode 112 includes the first part 112a to reduce the carriers accumulated in the n⁻-type cathode region 101. The first part 112a is located in the p-type anode region 102. The p-type impurity concentration of the p-type anode region 102 is less than the p-type impurity concentration of the p⁺-type anode region 103. A Schottky junction is formed between the p-type anode region 102 and the first part 112a. When the semiconductor device 100 is in the on-state, holes are not easily injected from the first part 112a into the p-type anode region 102. On the other hand, electrons are discharged from the p-type anode region 102 to the first part 112a. Therefore, the carriers that accumulate in the n$^-$-type cathode region 101 can be reduced.

In particular, the length L1 of the first part 112a is greater than the length L2 of the second part 112b. Therefore, the contact area between the p-type anode region 102 and the first part 112a can be increased. By increasing the contact area, the amount of electrons discharged from the p-type anode region 102 to the first part 112a can be increased. By reducing the electrons accumulated in the n$^-$-type cathode region 101, the holes that are injected into the n$^-$-type cathode region 101 also are reduced. According to the first embodiment, the carriers that accumulate in the n$^-$-type cathode region 101 when the semiconductor device 100 is in the on-state can be reduced, and the switching loss of the semiconductor device 100 can be reduced.

It is favorable for the p-type impurity concentration of the p-type anode region 102 to be not less than $1.0 \times 10^{16}$ atoms/cm$^3$ and not more than $1.0 \times 10^{18}$ atoms/cm$^3$. A good Schottky junction is formed between the p-type anode region 102 and the first part 112a by using such a concentration range.

In the example shown in FIG. 1, the anode electrode 112 further includes a third part 112c. The third part 112c is positioned between the first part 112a and the second part 112b. The third part 112c contacts the p-type anode region 102 in the X-direction. The X-direction length of the third part 112c is equal to the length L2 in the X-direction of the second part 112b.

Or, the anode electrode 112 may not include the third part 112c. A wide part that protrudes toward the cathode electrode 111 may contact the p$^+$-type anode region 103. However, in such a case, the contact area between the p$^+$-type anode region 103 and the anode electrode 112 is greater than when the third part 112c is provided. The injection of holes from the anode electrode 112 into the p$^+$-type anode region 103 is increased thereby. Accordingly, it is favorable for the anode electrode 112 to include the third part 112c to reduce the carriers accumulated in the n$^-$-type cathode region 101.

FIGS. 5 to 8 are perspective cross-sectional views showing portions of semiconductor devices according to modifications of the first embodiment.

Figure 5:
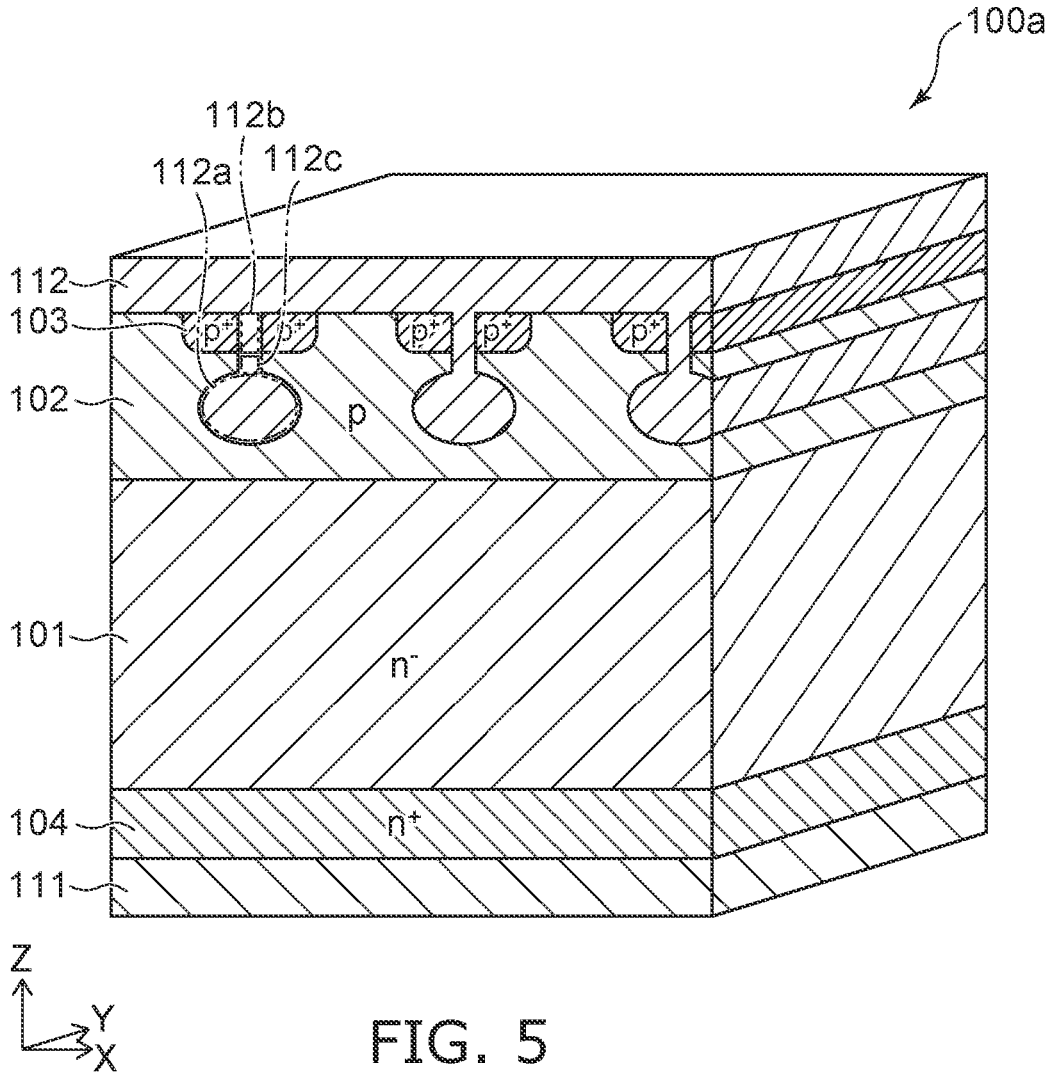
FIG. 5 is a perspective cross-sectional view showing a portion of a semiconductor devices according to a modification of the first embodiment.

In a semiconductor device 100a shown in FIG. 5, the p$^+$-type anode region 103 is located on a portion of the p-type anode region 102. Another portion of the p-type anode region 102 is arranged with the p$^+$-type anode region 103 in the X-direction.

Multiple p$^+$-type anode regions 103 are arranged in the X-direction. One second part 112b is located between a pair of p$^+$-type anode regions 103 and contacts the p$^+$-type anode regions 103. For example, each p$^+$-type anode region 103 extends in the Y-direction along the first and second parts 112a and 112b.

When the area of the p$^+$-type anode region 103 in the X-Y plane is small, the carriers that flow toward the n$^-$-type cathode region 101 when the semiconductor device 100a is in the on-state are reduced. The carriers that accumulate in the n$^-$-type cathode region 101 also are reduced. The switching loss of the semiconductor device 100a can be reduced thereby.

Figure 6:
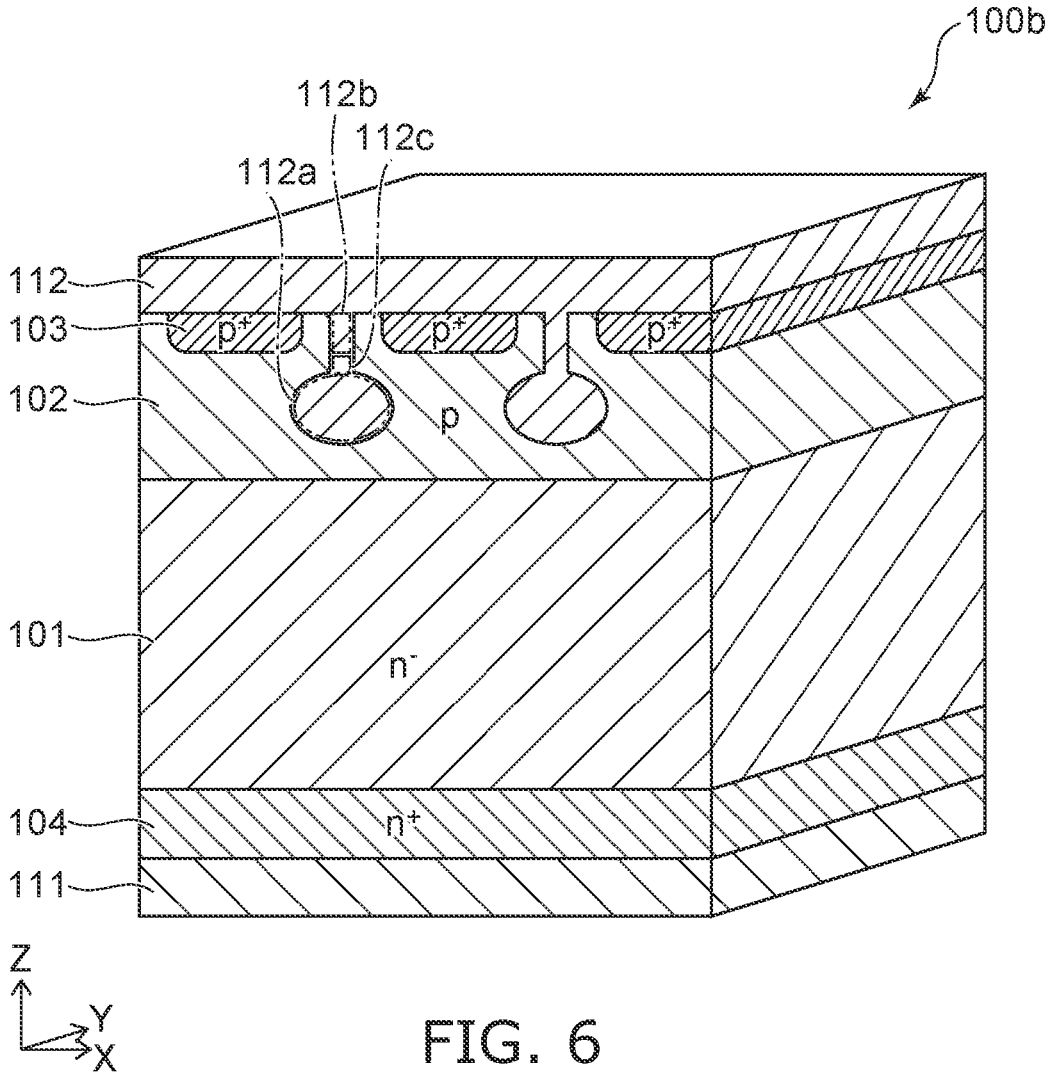
FIG. 6 is a perspective cross-sectional view showing a portion of a semiconductor devices according to a modification of the first embodiment.

In a semiconductor device 100b shown in FIG. 6, the second part 112b is arranged with the p$^+$-type anode region 103 in the X-direction, but is separated from the p$^+$-type anode region 103. For example, the p$^+$-type anode region 103 and the second part 112b are alternately arranged in the X-direction. A portion of the p-type anode region 102 is located between the second part 112b and the p$^+$-type anode region 103.

The contact area between the p$^+$-type anode region 103 and the anode electrode 112 can be smaller when the second part 112b is separated from the p$^+$-type anode region 103. The injection of holes from the anode electrode 112 into the p$^+$-type anode region 103 when the semiconductor device 100b is in the on-state can be suppressed by reducing the contact area between the p$^+$-type anode region 103 and the anode electrode 112. The carriers that accumulate in the n$^-$-type cathode region 101 can be further reduced thereby. According to the semiconductor device 100b, compared to the semiconductor device 100a, the switching loss can be further reduced.

Figure 7:
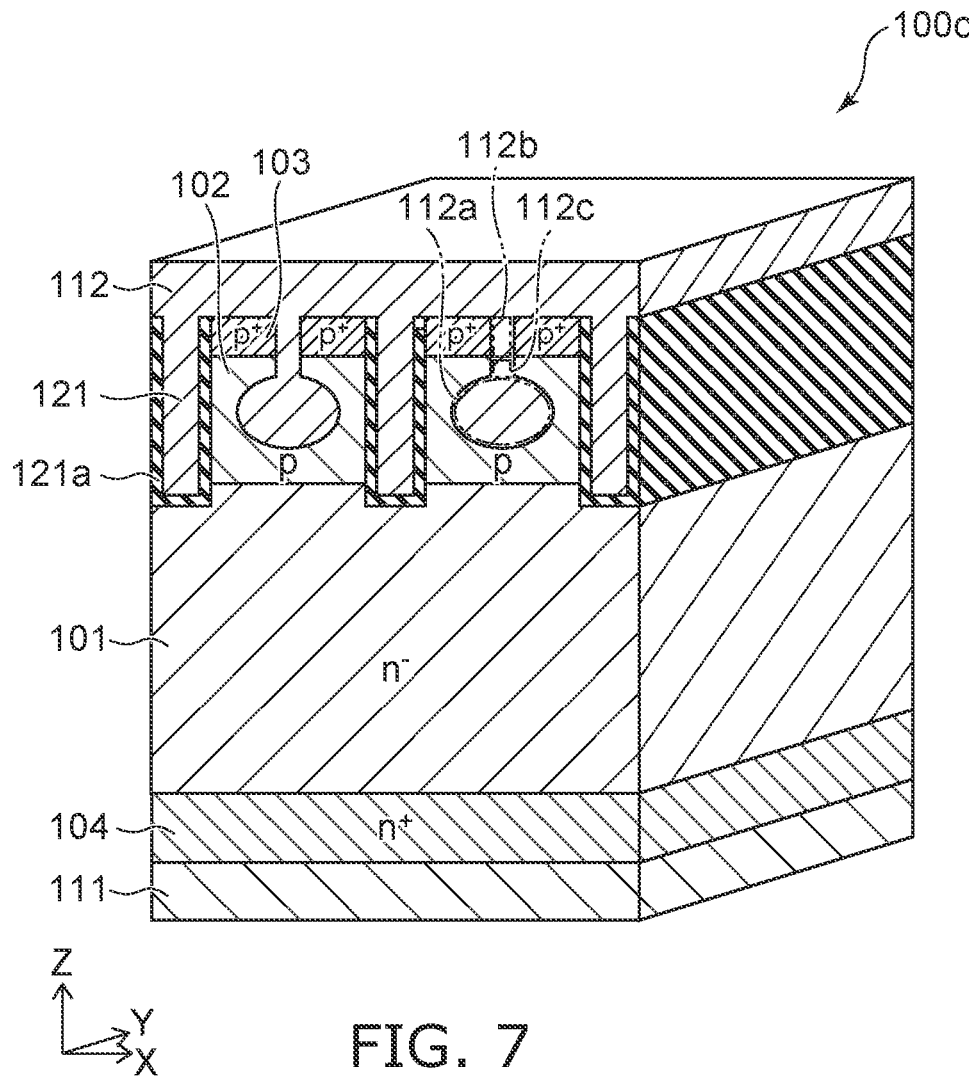
FIG. 7 is a perspective cross-sectional view showing a portion of a semiconductor devices according to a modification of the first embodiment.

A semiconductor device 100c shown in FIG. 7 further includes a conductive part 121. The conductive part 121 faces the p-type anode region 102 via an insulating layer 121a in the X-direction. The conductive part 121 is electrically connected with the anode electrode 112. Multiple conductive parts 121 are arranged in the X-direction; and each conductive part 121 extends in the Y-direction.

Figure 8:
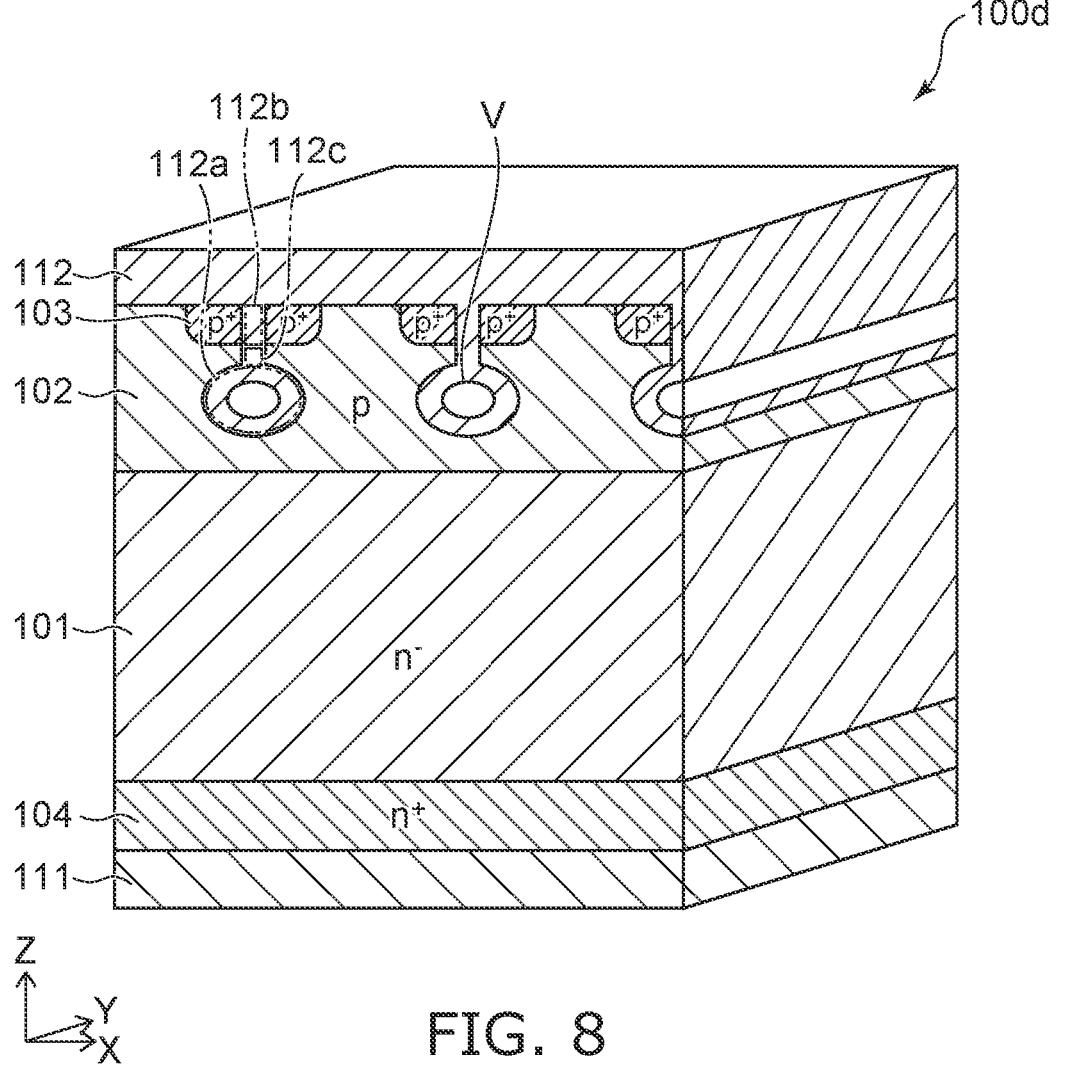
FIG. 8 is a perspective cross-sectional view showing a portion of a semiconductor devices according to a modification of the first embodiment.

In a semiconductor device 100d shown in FIG. 8, a void V exists in the first part 112a. For example, the void V is positioned at substantially the center of the first part 112a in the X-Z plane and exists directly under the second part 112b.

Voids V may exist respectively in the multiple first parts 112a. The void V may exist in only some of the multiple first parts 112a. As shown in FIG. 8, the void V may extend along the Y-direction. Multiple voids V that are separated from each other in the Y-direction also may exist.

Compressive stress is generated at the upper surface side when the semiconductor device 100d is manufactured. Cracks occur in the semiconductor region when the compressive stress is excessively high. As a result, for example, the leakage current of the semiconductor device 100d increases. When the void V is provided, at least a portion of the void V deforms according to the compressive stress. The compressive stress that is generated at the upper surface side of the semiconductor device 100d can be reduced thereby. The occurrence of cracks can be suppressed, and the leakage current of the semiconductor device 100d can be reduced.

Second Embodiment

Figure 9:
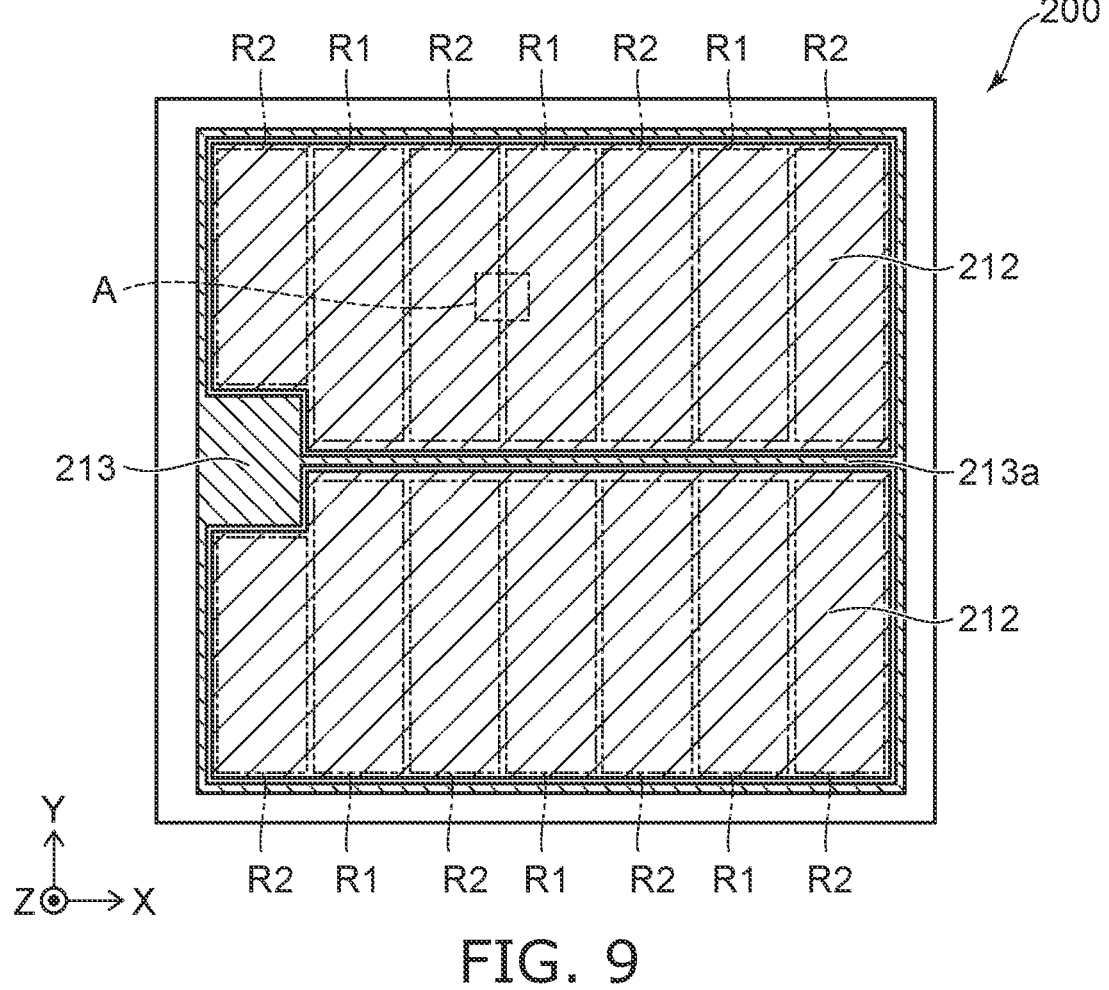
FIG. 9 is a plan view of a semiconductor device according to a second embodiment.
Figure 10:
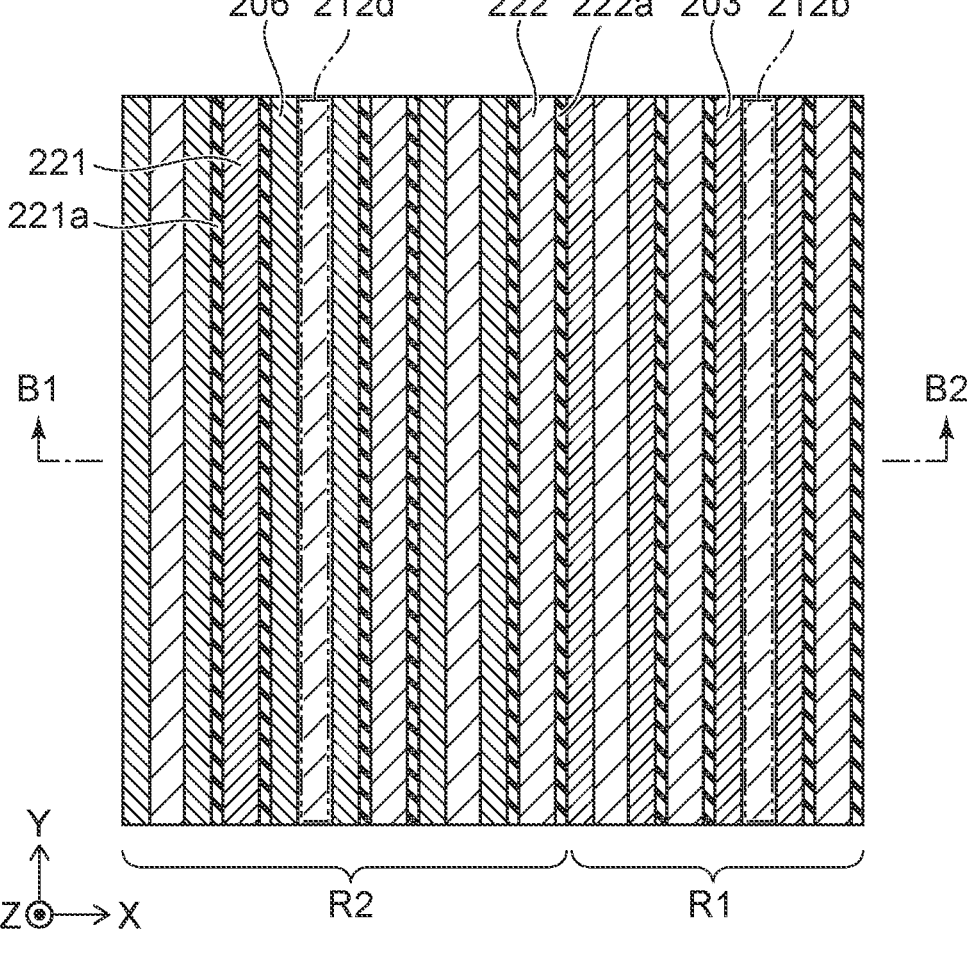
FIG. 10 is an enlarged plan view of portion A of FIG. 9.
Figure 11:
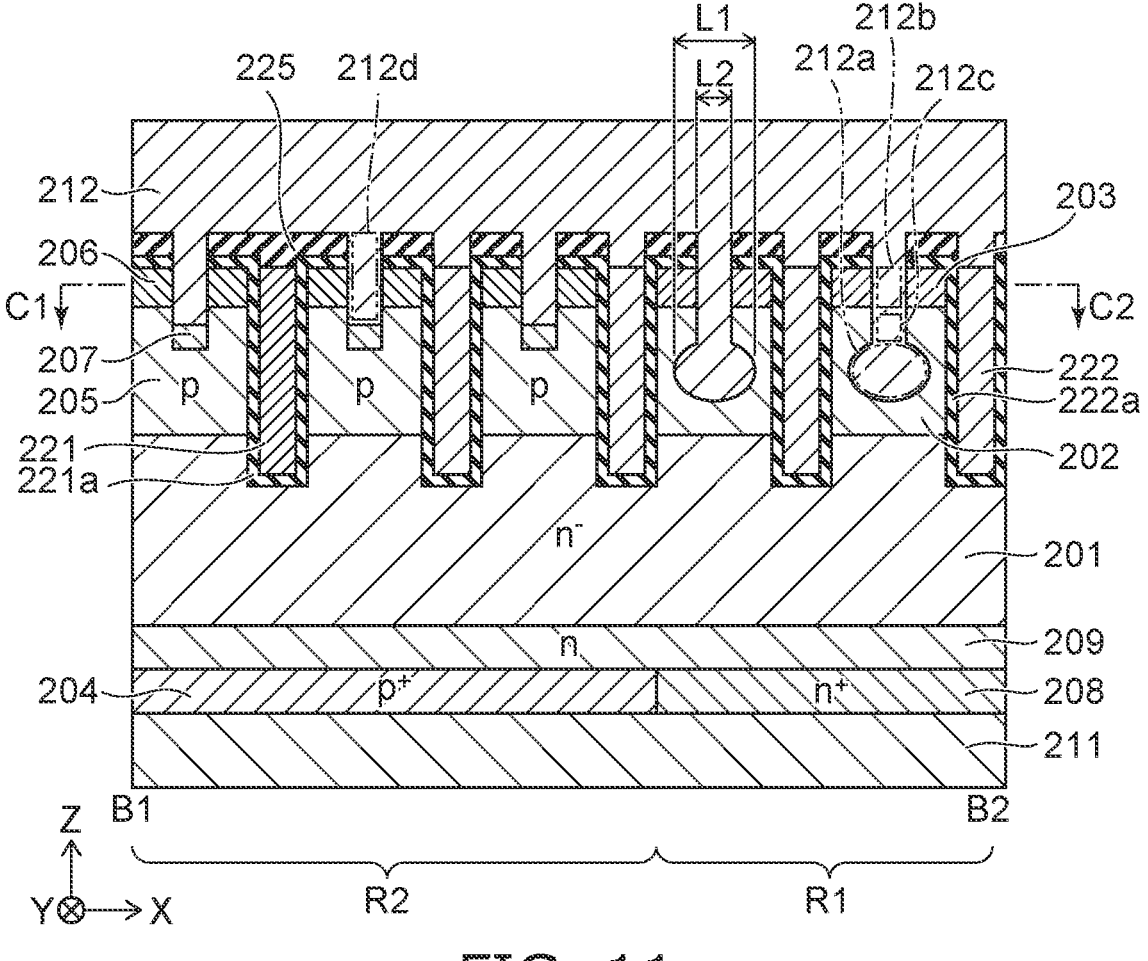
FIG. 11 is a B1-B2 cross-sectional view of FIG. 10.

FIG. 9 is a plan view of a semiconductor device according to a second embodiment. FIG. 10 is an enlarged plan view of portion A of FIG. 9. FIG. 11 is a B1-B2 cross-sectional view of FIG. 10. FIG. 10 corresponds to a C1-C2 cross section of FIG. 11.

The semiconductor device according to the second embodiment is an RC-IGBT. As shown in FIGS. 9 to 11, the semiconductor device 200 according to the second embodiment includes an n$^-$-type (first-conductivity-type) base region 201 (an example of the first semiconductor region), a p-type (second-conductivity-type) anode region 202 (an example of the second semiconductor region), a p$^+$-type anode region 203 (an example of the third semiconductor region), a p$^+$-type collector region 204 (an example of the fourth semiconductor region), a p-type base region 205 (an example of the fifth semiconductor region), an n$^+$-type emitter region 206 (an example of the sixth semiconductor region), a p$^+$-type contact region 207, an n$^+$-type cathode region 208, a collector electrode 211 (an example of the first electrode), an emitter electrode 212 (an example of the second electrode), a gate pad 213, a gate electrode 221, a conductive part 222, and an insulating layer 225.

As shown in FIG. 9, the emitter electrode 212 and the gate pad 213 are located at the upper surface of the semiconductor device 200. The emitter electrode 212 and the gate pad 213 are separated from each other. For example, multiple emitter electrodes 212 are arranged in the Y-direction. A gate wiring part 213a is provided around the emitter electrodes 212. A portion of the gate wiring part 213a extends in the Y-direction between the emitter electrodes 212. The gate wiring part 213a is electrically connected with the gate pad 213.

As shown in FIGS. 9 and 10, the semiconductor device 200 includes a diode region R1 and an IGBT region R2. In the example shown in FIG. 9, multiple diode regions R1 and multiple IGBT regions R2 are arranged in the X-direction and the Y-direction. The diode region R1 and the IGBT region R2 are alternately arranged in the X-direction.

As shown in FIG. 11, the collector electrode 211 is located at the lower surface of the semiconductor device 200. The collector electrode 211 and the emitter electrode 212 are separated from each other; and the multiple diode regions R1 and the multiple IGBT regions R2 are positioned between the collector electrode 211 and the emitter electrode 212.

The p-type anode region 202, the p$^+$-type anode region 203, the n$^+$-type cathode region 208, the conductive part 222, and a portion of the n$^-$-type base region 201 are located in each diode region R1.

The n$^+$-type cathode region 208 is located on a portion of the collector electrode 211 and is electrically connected with the collector electrode 211. A portion of the n$^-$-type base region 201 is located on the n$^+$-type cathode region 208. The p-type anode region 202 is located on the portion of the n$^-$-type base region 201 and positioned on the n$^+$-type cathode region 208.

The conductive part 222 faces the p-type anode region 202 via an insulating layer 222a in the X-direction. The p$^+$-type anode region 203 is located on the p-type anode region 202. The p-type impurity concentration of the p$^+$-type anode region 203 is greater than the p-type impurity concentration of the p-type anode region 202. The p-type anode region 202, the p$^+$-type anode region 203, and the conductive part 222 are electrically connected with the emitter electrode 212.

Similarly to the anode electrode 112 of the semiconductor device 100, the emitter electrode 212 of the semiconductor device 200 includes a first part 212a and a second part 212b. The first part 212a is located in the p-type anode region 202. The first part 212a contacts the p-type anode region 202; and a Schottky junction is formed between the p-type anode region 202 and the first part 212a. The second part 212b is located on the first part 212a and is arranged with the p$^+$-type anode region 203 in the X-direction. The second part 212b contacts the p$^+$-type anode region 203. The length L1 in the X-direction of the first part 212a is greater than the length L2 in the X-direction of the second part 212b.

The emitter electrode 212 may further include a third part 212c. The third part 212c is positioned between the first part 212a and the second part 212b. The third part 212c contacts the p-type anode region 202 in the X-direction. The X-direction length of the third part 212c is equal to the length L2 in the X-direction of the second part 212b.

Pluralities of the p-type anode regions 202, the p$^+$-type anode regions 203, the first parts 212a, the second parts 212b, and the conductive parts 222 are arranged in the X-direction in one diode region R1. The multiple p-type anode regions 202, the multiple p$^+$-type anode regions 203, the multiple first parts 212a, the multiple second parts 212b, and the multiple conductive parts 222 each are provided in stripe shapes and extend in the Y-direction.

The p$^+$-type collector region 204, the p-type base region 205, the n$^+$-type emitter region 206, the p$^+$-type contact region 207, the gate electrode 221, and another portion of the n$^-$-type base region 201 are located in each IGBT region R2.

The p$^+$-type collector region 204 is located on another portion of the collector electrode 211 and is electrically connected with the collector electrode 211. Another portion of the n$^-$-type base region 201 is located on the p$^+$-type collector region 204. The p-type base region 205 is located on the other portion of the n$^-$-type base region 201 and positioned on the p$^+$-type collector region 204.

The emitter electrode 212 further includes a fourth part 212d protruding toward the collector electrode 211. The n$^+$-type emitter region 206 is located on the p-type base region 205 and contacts the fourth part 212d in the X-direction. The p$^+$-type contact region 207 is located between the p-type base region 205 and the fourth part 212d in the Z-direction and is positioned lower than the n$^+$-type emitter region 206. The p-type impurity concentration of the p$^+$-type contact region 207 is greater than the p-type impurity concentration of the p-type base region 205.

The gate electrode 221 faces the p-type base region 205 via a gate insulating layer 221a in the X-direction. In the illustrated example, the gate electrode 221 also faces both the n$^-$-type base region 201 and the n$^+$-type emitter region 206 via the gate insulating layer 221a.

The emitter electrode 212 is electrically connected with the p-type base region 205, the n$^+$-type emitter region 206, and the p$^+$-type contact region 207. The insulating layer 225 is located between the emitter electrode 212 and the gate electrode 221; and the emitter electrode 212 and the gate electrode 221 are electrically isolated from each other.

Pluralities of the p-type base regions 205, the n$^+$-type emitter regions 206, the p$^+$-type contact regions 207, the fourth parts 212d, and the gate electrodes 221 are arranged in the X-direction in one IGBT region R2. The multiple p-type base regions 205, the multiple n$^+$-type emitter regions 206, the multiple p$^+$-type contact regions 207, the multiple fourth parts 212d, and the multiple gate electrodes 221 each are provided in stripe shapes and extend in the Y-direction. The Y-direction end portions of the gate electrode 221 are electrically connected with the gate wiring part 213a. The gate electrodes 221 are electrically connected with the gate pad 213 via the gate wiring part 213a.

Operations of the semiconductor device 200 will now be described.

A voltage that is not less than a threshold is applied to the gate electrode 221 in a state in which a positive voltage with respect to the emitter electrode 212 is applied to the collector electrode 211. A channel (an inversion layer) is thereby formed in the p-type base region 205. Electrons flow from the n$^+$-type emitter region 206 to the n$^-$-type base region 201 via the channel; and holes flow from the p$^+$-type collector region 204 to the n$^-$-type base region 201. The density of the carriers accumulated in the n$^-$-type base region 201 increases, and conductivity modulation occurs. The electrical resistance in the n$^-$-type base region 201 is greatly reduced thereby, and the IGBT region R2 is set to the on-state. Subsequently, when the voltage applied to the gate electrode 221 drops below the threshold, the channel in the p-type base region 205 disappears, and the IGBT region R2 is switched to the off-state.

After the IGBT region R2 is switched to the off-state, the electrons that accumulated in the n$^-$-type base region 201 are discharged to the collector electrode 211 via the p$^+$-type collector region 204. The holes are discharged to the emitter electrode 212 via the p-type base region 205.

For example, the diode region R1 operates when a positive voltage with respect to the collector electrode 211 is applied to the emitter electrode 212 due to an induced electromotive force generated in a circuit including the semiconductor device 200. Holes flow from the p-type anode region 202 to the $n^-$-type base region 201; and electrons flow from the $n^+$-type cathode region 208 toward the $n^-$-type base region 201. The diode region R1 functions as a freewheeling diode (FWD).

As shown in FIG. 11, an n-type buffer region 209 may be provided between the $p^+$-type collector region 204 and the $n^-$-type base region 201 and between the $n^+$-type cathode region 208 and the $n^-$-type base region 201. The n-type impurity concentration of the n-type buffer region 209 is less than the n-type impurity concentration of the $n^+$-type cathode region 208 and greater than the n-type impurity concentration of the $n^-$-type base region 201. By providing the n-type buffer region 209, the spreading of the depletion layer in the $n^-$-type base region 201 can be more reliably suppressed by the n-type buffer region 209.

In the IGBT region R2, some of the multiple gate electrodes 221 may be replaced with the conductive part 222. By replacing some of the gate electrodes 221 with the conductive part 222, the density of the carriers accumulated in the $n^-$-type base region 201 when the IGBT region R2 is in the on-state can be increased, and the electrical resistance of the semiconductor device 200 can be further reduced. The conductive part 222 can be omitted from the diode region R1.

Examples of the materials of the components of the semiconductor device 200 will now be described.

The $n^-$-type base region 201, the p-type anode region 202, the $p^+$-type anode region 203, the $p^+$-type collector region 204, the p-type base region 205, the $n^+$-type emitter region 206, the $p^+$-type contact region 207, the $n^+$-type cathode region 208, and the n-type buffer region 209 include silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity.

The collector electrode 211, the emitter electrode 212, the gate pad 213, and the gate wiring part 213a include metals such as titanium, tungsten, aluminum, etc. The gate electrode 221 and the conductive part 222 include conductive materials such as polysilicon, etc. The gate insulating layer 221a, the insulating layer 222a, and the insulating layer 225 include insulating materials such as silicon oxide, silicon nitride, silicon oxynitride, etc.

For example, the n-type impurity concentration of the $n^-$-type base region 201 is not less than $1.0 \times 10^{13}$ atoms/cm$^3$ and not more than $1.0 \times 10^{15}$ atoms/cm$^3$. The p-type impurity concentrations of the p-type anode region 202 and the p-type base region 205 are not less than $1.0 \times 10^{16}$ atoms/cm$^3$ and not more than $1.0 \times 10^{18}$ atoms/cm$^3$. The p-type impurity concentration of the $p^+$-type anode region 203 are greater than $1.0 \times 10^{18}$ atoms/cm$^3$ and not more than $5.0 \times 10^{21}$ atoms/cm$^3$. The p-type impurity concentrations of the $p^+$-type collector region 204 and the $p^+$-type contact region 207 are greater than $1.0 \times 10^{18}$ atoms/cm$^3$ and not more than $1.0 \times 10^{21}$ atoms/cm$^3$. The n-type impurity concentrations of the $n^+$-type emitter region 206 and the $n^+$-type cathode region 208 are not less than $1.0 \times 10^{18}$ atoms/cm$^3$ and not more than $1.0 \times 10^{21}$ atoms/cm$^3$. The n-type impurity concentration of the n-type buffer region 209 is not less than $1.0 \times 10^{14}$ atoms/cm$^3$ and not more than $1.0 \times 10^{18}$ atoms/cm$^3$.

Advantages of the second embodiment will now be described.

In the semiconductor device 200 according to the second embodiment, the emitter electrode 212 includes the first part 212a and the second part 212b. The first part 212a and the second part 212b are located in the diode region R1. The p-type impurity concentration of the p-type anode region 202 is less than the p-type impurity concentration of the $p^+$-type anode region 203; and a Schottky junction is formed between the p-type anode region 202 and the first part 212a. The injection of holes from the first part 212a into the p-type anode region 202 is suppressed, and electrons are discharged from the p-type anode region 202 to the first part 212a; as a result, the carriers that accumulate in the n-type base region 201 when the IGBT region R2 is in the on-state can be reduced. In particular, the carriers that accumulate in the $n^-$-type base region 201 can be further reduced because the length L1 of the first part 212a is greater than the length L2 of the second part 212b. According to the second embodiment, similarly to the first embodiment, the switching loss of the semiconductor device 200 can be reduced.

The semiconductor device 200 includes the IGBT region R2. A parasitic diode that is made of the n-type base region 201 and the p-type base region 205 exists in the IGBT region R2. When the diode region R1 is in the on-state, holes are injected into the $n^-$-type base region 201 via the parasitic diode of the IGBT region R2. Therefore, in the semiconductor device 200 that is an RC-IGBT, the switching loss problem easily becomes pronounced because more carriers than the design value are easily accumulated in the $n^-$-type base region 201. By providing the first part 212a and the second part 212b in the semiconductor device 200, the carrier density in the $n^-$-type base region 201 can be effectively reduced and the switching loss of the semiconductor device 200 can be reduced.

Similarly to the semiconductor device 100d shown in FIG. 8, the void V may exist in the first part 212a. In the semiconductor device 200, the gate insulating layer 221a, the insulating layer 222a, the insulating layer 225, etc., exist at the front side. The compressive stress increases when these insulating layers include oxide materials. Therefore, cracks occur more easily in the semiconductor region at the periphery of the gate insulating layer 221a, the insulating layer 222a, the insulating layer 225, etc. When the void V exists in the first part 212a, the compressive stress can be reduced, and the leakage current of the semiconductor device 200 due to the cracks can be reduced.

The conductive part 222 in the diode region R1 of the semiconductor device 200 may be omitted. However, the uniformity and stability of the processing when manufacturing the semiconductor device 200 can be improved by providing the conductive part 222 in the diode region R1 and by providing the gate electrode 221 in the IGBT region R2. For example, the depth difference, shape difference, etc., between the gate electrodes 221 can be reduced, the fluctuation of the characteristics of the semiconductor device 200 can be suppressed, and the yield can be increased. The concentration of the current due to the difference between the structure of the upper surface side of the diode region R1 and the structure of the upper surface side of the IGBT region R2 can be suppressed.

Embodiments of the invention include the following configurations.

(Configuration 1)

A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type;

a third semiconductor region located on the second semiconductor region, the third semiconductor region being of the second conductivity type, a second-conductivity-type impurity concentration of the third semiconductor region being greater than a second-conductivity-type impurity concentration of the second semiconductor region; and a second electrode located on the third semiconductor region, the second electrode including a first part located in the second semiconductor region, and a second part positioned on the first part, the second part contacting the third semiconductor region in a second direction perpendicular to a first direction, the first direction being from the first electrode toward the first semiconductor region, a length in the second direction of the first part being greater than a length in the second direction of the second part.

(Configuration 2)

A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type; and a second electrode located on the second semiconductor region, the second electrode including a first part located in the second semiconductor region, and a second part positioned on the first part, a length of the first part in a second direction perpendicular to a first direction being greater than a length of the second part in the second direction, the first direction being from the first electrode toward the first semiconductor region, a Schottky junction being formed between the first part and the second semiconductor region.

(Configuration 3)

A semiconductor device, comprising:

a first electrode;

a first semiconductor region located on the first electrode, the first semiconductor region being of a first conductivity type;

a second semiconductor region located on the first semiconductor region, a second-conductivity-type impurity concentration of the second semiconductor region being not less than $1.0 \times 10^{16}$ atoms/cm$^3$ and not more than $1.0 \times 10^{18}$ atoms/cm$^3$; and a second electrode located on the second semiconductor region, the second electrode including a first part contacting the second semiconductor region, and a second part positioned on the first part, a length of the first part in a second direction perpendicular to a first direction being greater than a length of the second part in the second direction, the first direction being from the first electrode toward the first semiconductor region.

(Configuration 4)

The device according to any one of Configurations 1 to 3, further comprising:

a conductive part facing the second semiconductor region via an insulating layer in the second direction, the conductive part being electrically connected with the second electrode.

(Configuration 5)

The device according to any one of Configurations 1 to 4, further comprising:

a fourth semiconductor region located between a portion of the first electrode and a portion of the first semiconductor region, the fourth semiconductor region being of the second conductivity type;

a fifth semiconductor region located on the portion of the first semiconductor region, the fifth semiconductor region being of the second conductivity type;

a sixth semiconductor region located on the fifth semiconductor region, the sixth semiconductor region being of the first conductivity type; and a gate electrode facing the fifth semiconductor region via a gate insulating layer in the second direction.

(Configuration 6)

The device according to any one of Configurations 1 to 5, wherein the second electrode further includes a third part positioned between the first part and the second part, the third part contacts the second semiconductor region in the first direction, and a length of the third part in the second direction is equal to a length of the second part in the second direction.

(Configuration 7)

The device according to any one of Configurations 1 to 6, wherein the first part includes a void.

According to the embodiments described above, a semiconductor device is provided in which the switching loss can be reduced.

In the embodiments, the relative level of impurity concentration between the semiconductor regions can be confirmed by, for example, using Scanning Capacitance Microscope (SCM). The carrier concentration in each semiconductor region can be considered equal to the concentration of impurities activated in each semiconductor region. Accordingly, the relative level of the carrier concentration between the semiconductor regions can also be confirmed using the SCM. The impurity concentration in each semiconductor region can be measured by, for example, Secondary Ion Mass Spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type;

a third semiconductor region located on the second semiconductor region, the third semiconductor region being of the second conductivity type, a second-conductivity-type impurity concentration of the third semiconductor region being greater than a second-conductivity-type impurity concentration of the second semiconductor region; and a second electrode located on the third semiconductor region, the second electrode including a first part located in the second semiconductor region, and a second part positioned on the first part, the second part contacting the third semiconductor region in a second direction perpendicular to a first direction, the first direction being from the first electrode toward the first semiconductor region, a length in the second direction of the first part being greater than a length in the second direction of the second part.

2. The device according to claim 1, further comprising:

a conductive part facing the second semiconductor region via an insulating layer in the second direction, the conductive part being electrically connected with the second electrode.

3. The device according to claim 1, further comprising:

a fourth semiconductor region located between a portion of the first electrode and a portion of the first semiconductor region, the fourth semiconductor region being of the second conductivity type;

a fifth semiconductor region located on the portion of the first semiconductor region, the fifth semiconductor region being of the second conductivity type;

a sixth semiconductor region located on the fifth semiconductor region, the sixth semiconductor region being of the first conductivity type; and a gate electrode facing the fifth semiconductor region via a gate insulating layer in the second direction.

4. The device according to claim 1, wherein the second electrode further includes a third part positioned between the first part and the second part, the third part contacts the second semiconductor region in the second direction, and a length of the third part in the second direction is equal to a length of the second part in the second direction.

5. The device according to claim 1, wherein the first part includes a void.

6. A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type; and a second electrode located on the second semiconductor region, the second electrode including a first part located in the second semiconductor region, and a second part positioned on the first part, a length of the first part in a second direction perpendicular to a first direction being greater than a length of the second part in the second direction, the first direction being from the first electrode toward the first semiconductor region, a Schottky junction being formed between the first part and the second semiconductor region.

7. The device according to claim 6, further comprising:

a conductive part facing the second semiconductor region via an insulating layer in the second direction, the conductive part being electrically connected with the second electrode.

8. The device according to claim 6, further comprising:

a fourth semiconductor region located between a portion of the first electrode and a portion of the first semiconductor region, the fourth semiconductor region being of the second conductivity type;

a fifth semiconductor region located on the portion of the first semiconductor region, the fifth semiconductor region being of the second conductivity type;

a sixth semiconductor region located on the fifth semiconductor region, the sixth semiconductor region being of the first conductivity type; and a gate electrode facing the fifth semiconductor region via a gate insulating layer in the second direction.

9. The device according to claim 6, wherein the second electrode further includes a third part positioned between the first part and the second part, the third part contacts the second semiconductor region in the second direction, and a length of the third part in the second direction is equal to a length of the second part in the second direction.

10. The device according to claim 6, wherein the first part includes a void.

11. A semiconductor device, comprising:

a first electrode;

a first semiconductor region located on the first electrode, the first semiconductor region being of a first conductivity type;

a second semiconductor region located on the first semiconductor region, a second-conductivity-type impurity concentration of the second semiconductor region being not less than $1.0 \times 10^{16}$ atoms/cm$^3$ and not more than $1.0 \times 10^{18}$ atoms/cm$^3$; and a second electrode located on the second semiconductor region, the second electrode including a first part contacting the second semiconductor region, and a second part positioned on the first part, a length of the first part in a second direction perpendicular to a first direction being greater than a length of the second part in the second direction, the first direction being from the first electrode toward the first semiconductor region.

12. The device according to claim 11, further comprising:

a conductive part facing the second semiconductor region via an insulating layer in the second direction, the conductive part being electrically connected with the second electrode.

13. The device according to claim 11, further comprising:

a fourth semiconductor region located between a portion of the first electrode and a portion of the first semiconductor region, the fourth semiconductor region being of the second conductivity type;

a fifth semiconductor region located on the portion of the first semiconductor region, the fifth semiconductor region being of the second conductivity type;

a sixth semiconductor region located on the fifth semiconductor region, the sixth semiconductor region being of the first conductivity type; and a gate electrode facing the fifth semiconductor region via a gate insulating layer in the second direction.

14. The device according to claim 11, wherein the second electrode further includes a third part positioned between the first part and the second part, the third part contacts the second semiconductor region in the second direction, and a length of the third part in the second direction is equal to a length of the second part in the second direction.

15. The device according to claim 11, wherein the first part includes a void.

16. The device according to claim 6, wherein the second part is separated from the third semiconductor region in the second direction, and a portion of the second semiconductor region is located between the second part and the third semiconductor region in the second direction.

17. The device according to claim 11, wherein the second part is separated from the third semiconductor region in the second direction, and a portion of the second semiconductor region is located between the second part and the third semiconductor region in the second direction.

* * * * *